US007791208B2

(12) United States Patent
Bayerer

(10) Patent No.: US 7,791,208 B2
(45) Date of Patent: Sep. 7, 2010

(54) POWER SEMICONDUCTOR ARRANGEMENT

(75) Inventor: Reinhold Bayerer, Warstein (DE)

(73) Assignee: Infineon Technologies AG, Neubiberg (DE)

(*) Notice: Subject to any disclaimer, the term of this patent is extended or adjusted under 35 U.S.C. 154(b) by 279 days.

(21) Appl. No.: 11/862,677

(22) Filed: Sep. 27, 2007

(65) Prior Publication Data

US 2009/0085219 A1 Apr. 2, 2009

(51) Int. Cl.
*H01L 29/40* (2006.01)

(52) U.S. Cl. ............... 257/776; 257/773; 257/E21.575; 257/E23.078

(58) Field of Classification Search ................. 257/776, 257/773, E21.575, E23.078, E23.079; 438/121
See application file for complete search history.

(56) References Cited

U.S. PATENT DOCUMENTS

| | | | | |
|---|---|---|---|---|
| 3,590,328 | A * | 6/1971 | Frescura et al. | 361/708 |
| 4,907,068 | A | 3/1990 | Amann et al. | |
| 5,296,735 | A | 3/1994 | Fukunaga | |
| 5,541,453 | A | 7/1996 | Stockmeier et al. | |
| 6,809,411 | B2 | 10/2004 | Hierholzer | |
| 7,279,963 | B2 | 10/2007 | Passe et al. | |

FOREIGN PATENT DOCUMENTS

| | | |
|---|---|---|
| DE | 4124757 | 7/1992 |
| DE | 19927285 | 12/2000 |
| DE | 10103472 | 8/2002 |
| DE | 102004027185 | 12/2005 |
| DE | 102004046806 | 4/2006 |
| EP | 0277546 | 1/1988 |
| EP | 0584668 | 8/1993 |

OTHER PUBLICATIONS

Fancort Industries, Inc., "SMT Lead Forming Equipment & Services," Interactive Media Associates, 3 pages (1999-2007). <http://www.fancort.com/smt/FancortIndustriesInc.>.

"Press-Fit Technology," Overview, 2 pages (date unknown). <http://www.ept.de/englisch/pressfit_technology/overview.htm>.

Delphi, "Delphi Compliant Pin Technology," 3 pages, (date unknown). <http://delphi.com/manufactures/auto/ee/connect/other/compliant/>.

* cited by examiner

*Primary Examiner*—Zandra Smith
*Assistant Examiner*—Paul E Patton
(74) *Attorney, Agent, or Firm*—Dicke, Billig & Czaja, PLLC

(57) ABSTRACT

A power semiconductor arrangement is provided that includes a power semiconductor chip being electrically connected to a set of plug-like elements with at least two plug-like elements and further including a sheet metal strip line including a set of openings receiving the first set of plug-like elements, where the set of openings in the sheet metal strip line and the set of plug-like elements establish a press fit connection.

23 Claims, 18 Drawing Sheets

POWER SEMICONDUCTOR ARRANGEMENT

BACKGROUND

One aspect relates to power semiconductor arrangements, and in particular to power semiconductor modules.

Power semiconductor modules are used, inter alia, for switching high currents and high voltages. However, parasitic inductances in the modules and connections to the modules may cause loss of power and generate unwanted over-voltages due to the fast switching of high currents or high voltages.

SUMMARY

A power semiconductor arrangement is provided which include a power semiconductor chip being electrically connected to a set of plug-like elements with at least two plug-like elements and further including a sheet metal strip line including a set of openings receiving the first set of plug-like elements, where the set of openings in the sheet metal strip line and the set of plug-like elements establish a press fit connection.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

The embodiments can be better understood with reference to the following drawings and description. The components in the figures are not necessarily to scale, instead emphasis being placed upon illustrating the principles of the embodiments. Moreover, in the figures, like reference numerals designate corresponding parts.

DETAILED DESCRIPTION

Figure 1:
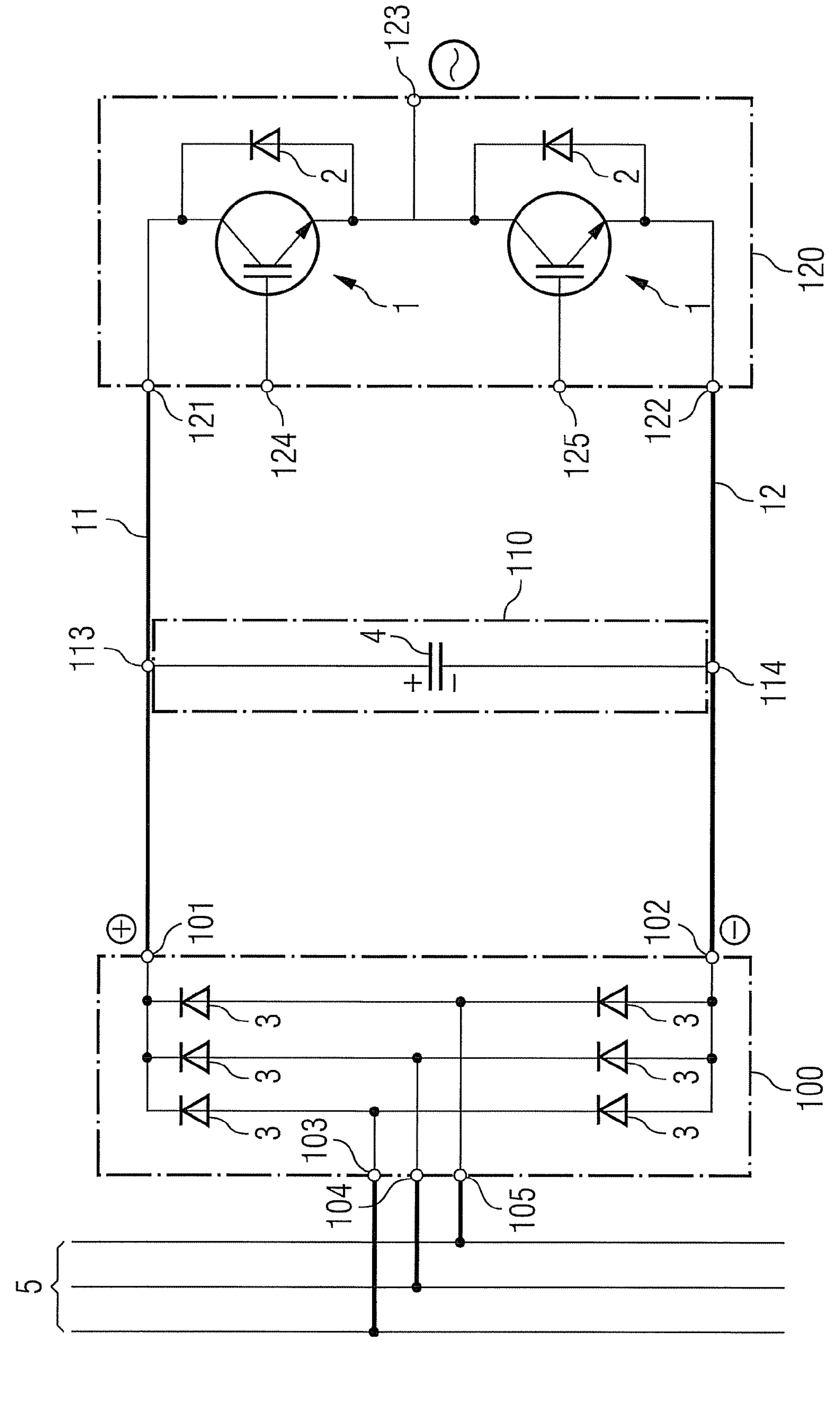
FIG. 1 is a circuit diagram of a power semiconductor arrangement including first and second power semiconductor modules connected by a strip line to a control module.

In the following Detailed Description, reference is made to the accompanying drawings, which form a part hereof, and in which is shown by way of illustration specific embodiments in which the invention may be practiced. In this regard, directional terminology, such as “top,” “bottom,” “front,” “back,” “leading,” “trailing,” etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides is a power semiconductor arrangement including a semiconductor substrate with at least one patterned metallization layer. The arrangement further includes a power semiconductor chip being arranged on the metallization layer with at least one first load terminal and one second load terminal, the first load terminal being connected to a first set of plug-like elements, the second load terminal being connected to a second set of plug-like elements. A further electronic component of the module includes at least one first load terminal and one second load terminal, the first load terminal being connected to a third set of plug-like elements, and the second load terminal being connected to a fourth set of plug-like elements. A first sheet metal strip line includes a first set of openings receiving the first set of plug-like elements, and a third set of openings receiving the third set of plug-like elements. A second sheet metal strip line includes a second set of openings receiving the second set of plug-like elements, and a fourth set of openings receiving the fourth set of plug-like elements. The openings in the sheet metal strip lines and the plug-like elements establish a press fit connection. The sheet metal strip lines being arranged in parallel such that the respective currents in the sheet metal strip lines flow in an opposite direction.

When assembling a power semiconductor arrangement, a set of plug-like elements electrically connected to a power semiconductor chip is provided. Also, a sheet metal strip line is provided that includes a set of openings adapted to receive the set of plug-like elements. The sheet metal strip line is positioned such that the openings are aligned with the plug-like elements. The sheet metal strip line is pressed onto the plug-like elements such that the plug-like elements penetrate into the openings thereby establishing a press fit connection.

Embodiments of power semiconductor arrangements disclosed herein provide an easy to assemble, low inductive connection to and within power semiconductor modules.

FIG. 1 is a circuit diagram of a power semiconductor arrangement including a first power semiconductor module 100 and a second power semiconductor module 120 connected to a capacitor module 110 by a strip line arrangement including flat conductive sheets (herein also referred to as strip lines), such as strip lines 11, 12 or conductive sheets 11, 12. The first power semiconductor module 100 is, in the present example, a rectifier bridge module and includes six diodes 3, power input terminals 103, 104, 105, and power output terminals 101, 102. Each of the power input terminals is connected to one of three phases of a mains supply 5, for example, by strip lines. The second power semiconductor module 120 includes, in a half bridge configuration supplied with electrical power through power supply terminals 121, 122, two controllable power semiconductor chips 1 such as, for example, Insulated Gate Bipolar Transistors (IGBT), and free wheeling diodes 2. However, other controllable power semiconductor chips, such as MOSFETS, Thyristors, etc. are applicable as well. The half bride includes an upper half bridge leg controllable by a control input 124, and a lower half bridge leg controllable by a control input 125. A capacitor module 110 including a DC link capacitor 4 is connected through power terminals 113, 114 to the strip lines 11 and 12. The output of the half bridge is connected to a phase output power terminal 123. In order to increase ampacity, instead of just one controllable power semiconductor chip 1 a number of, for example, identical, power semiconductor chips may be connected in parallel.

Figure 2:
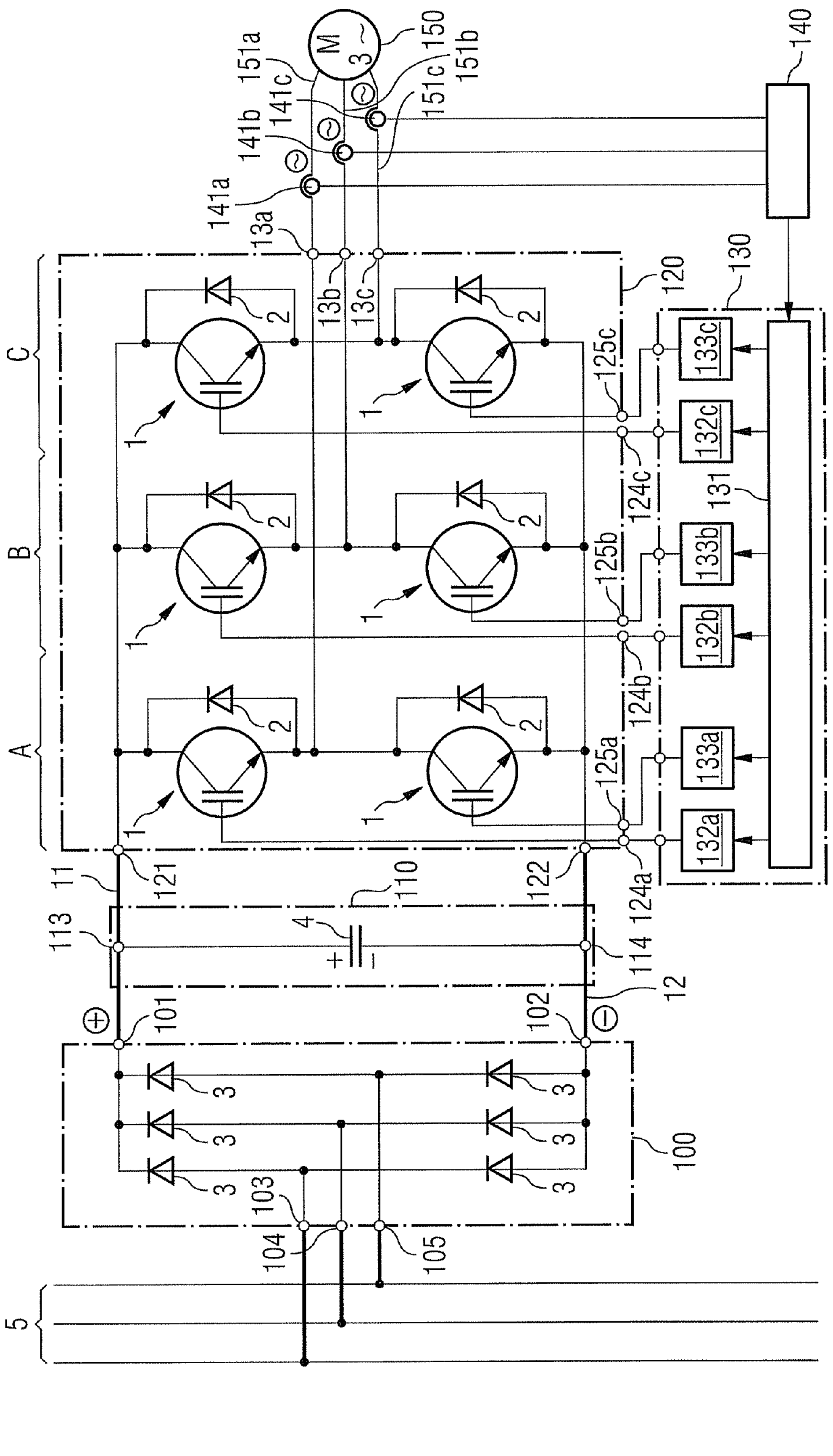
FIG. 2 is a circuit diagram of a power semiconductor arrangement including first and second power semiconductor modules connected by a strip line to a control module.

FIG. 2 is a circuit diagram of a further exemplary power semiconductor arrangement having a number of, for example, identical, power semiconductor chips connected in parallel. Referring to FIG. 2, the second power semiconductor module 120, instead of just one half bridge, includes three half bridges A, B, C. The upper half bridge legs of half bridges A, B, C are controllable through control terminals 124*a*, 124*b* and 124*c*, and the lower half bridge legs through control terminals 125*a*, 125*b* and 125*c*. The half bridges A, B, C are connected to power output terminals 13*a*, 13*b* and 13*c*, respectively. A control unit 130 including a control circuit 131 and driver circuits 132*a*, 132*b*, 132*c*, 133*a*, 133*b*, 133*c* is connected to the control terminals 124*a*, 124*b*, 124*c*, 125*a*, 125*b* and 125*c*. The control circuit 131 is adapted to control the driver circuits 132*a*, 132*b*, 132*c*, 133*a*, 133*b*, 133*c*, for example, to switch particular ones of the controllable power semiconductor chips 1 on or off. The control unit 130 or any parts of it may be integrated in the power semiconductor module 120 or arranged separately from the module 120 as illustrated in FIG. 2.

A load 150, for example, a three-phase motor M, is connected by lines 151*a*, 151*b*, 151*c* to phase output power terminals 13*a*, 13*b* and 13*c* of module 120. To the lines 151*a*, 151*b*, 151*c* current sensors 141*a*, 141*b* and 141*c*, respectively, are coupled. The current sensors 141*a*, 141*b* and 141*c* detect the currents in the lines 151*a*, 151*b* and 151*c*. A monitoring unit 140 connected to the control circuit 131 monitors the signals of the current sensors 141*a*, 141*b*, 141*c* and enables the control circuit 131 to control one, some, or all of the power semiconductor chips 1 dependent on the output currents in lines 141*a*, 141*b*, 141*c*.

Figure 3A:
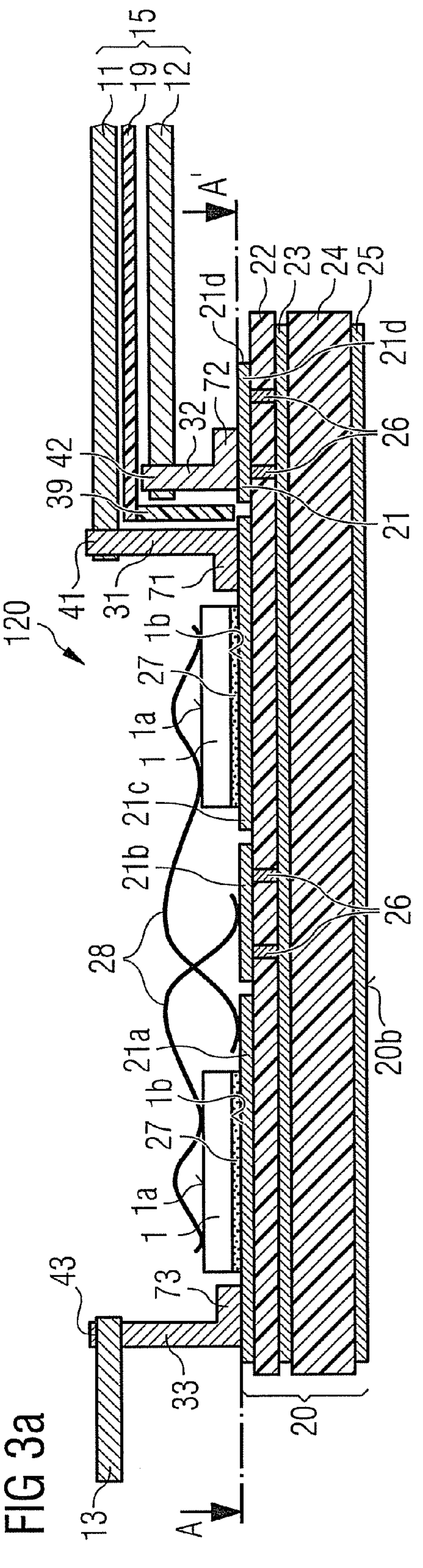
FIG. 3*a* is a vertical cross sectional view of a power semiconductor module including power terminals and a multilayer substrate.

FIG. 3*a* is a cross sectional view of the power semiconductor module 120 which includes the power semiconductor chips 1, a substrate 20 with at least one metal layer 21, 23, 25 and at least one ceramic layer 22, 24 arranged between adjacent metal layers 21, 23, 25. The top metal layer 21 of the substrate 20 has sections 21*a*, 21*b*, 21*c*, 21*d* arranged in a short distance from each other. The components attached to the substrate are interconnected by the metal layers 23, 25 of the substrate 20. Further, to electrically interconnect different metal layers or sections of different metal layers, vias 26 are arranged in the ceramic layers 22. Optionally, the bottom metal layer 25 may be electrically insulated against the top metal layer 21 or against one of the metal layers 23 or against both dependent on the circuit requirements.

The controllable power semiconductor chips 1 include terminal areas 1*a*, 1*b* for electrical connection. Such terminal areas 1*a*, 1*b* may be, for example, metallization layers such as aluminum and/or copper layers on the semiconductor body of the chip 1, and provide an electrical connection to a drain area, a source area, a collector area, an emitter area, an anode area, or a cathode area as the case may be. In case of a device including a vertical structure, the terminal areas 1*a* and 1*b* of the chip 1 may be arranged on opposite sides of the chip 1. Alternatively, in case of a device including a lateral structure, the terminal areas 1*a* and 1*b* of chip 1 may be arranged on the same side of chip 1.

The controllable power semiconductor chips 1 are connected to sections 21*a* and 21*c* by solder 27 and to sections 21*a* and 21*b* by bonding wires. Instead of solder, brazing, transient liquid phase soldering, electrically conductive gluing or low temperature joining technique (LTJT) using a silver paste are applicable as well.

To externally connect the module 120, for example, to a power supply, to a load or to a DC-link capacitor, the module includes power terminals accessible and electrically contactable from the outside of the power semiconductor module 120, that is, from outside of a housing of the module 120 (not illustrated in the drawings). Such a power terminal includes plug-like elements 41, 42, 43 as part of a press-fit connection, for example, as a male plug or a female plug. In FIG. 3*a*, the plug-like elements 41, 42, 43 are electrically connected to the power semiconductor chips 1 and lugs 31, 32 and 33 to the sections 21*a*, 21*c* and 21*d*. The connecting lugs 31, 32, 33 includes joining legs 71, 72 and 73, arranged adjacent to the respective joining leg 71, 72, 73 facing towards the substrate 20. As illustrated in FIG. 3*a*, a power terminal 41, 42, 43 and the respective connecting lug 31, 32, 33 may optionally be made in one piece. A connecting lug 31, 32, 33 may, for example, be made of a flat, angled or bent metal plate, or a bulky metal wire and include, in a section plane parallel to the bottom side 20*b* of the substrate, a cross-sectional area of, for example, more than 5 $mm^2$. The bottom side 20*b* of the substrate 20 is facing away from the power semiconductor chips 1. An insulation sheet 39 is arranged between the connecting lugs 31, 32.

To electrically connect a joining leg 71, 72 and 73 to a terminal area 1*a* or 1*b* of the chip 1, the respective joining leg may be directly joined to a terminal area 1*a* arranged on one side of the chip 1 facing away from the substrate 10, or to a section 21*a*, 21*b*, 21*c*, 21*d* of one of the metal layers 21, 23, 25. As joining technique, soldering, brazing, transient liquid phase soldering, welding, bonding, electrically conductive gluing or low temperature joining technique (LTJT) using a silver paste may be applied. Alternatively, a joining leg 71, 72, 73 may be pressed directly against the respective terminal area 1*a* or against the respective section 21*a*, 21*b*, 21*c*, 21*d* of one of the metal layers 21, 23, 25 to form a pressure contact.

Figure 3B:
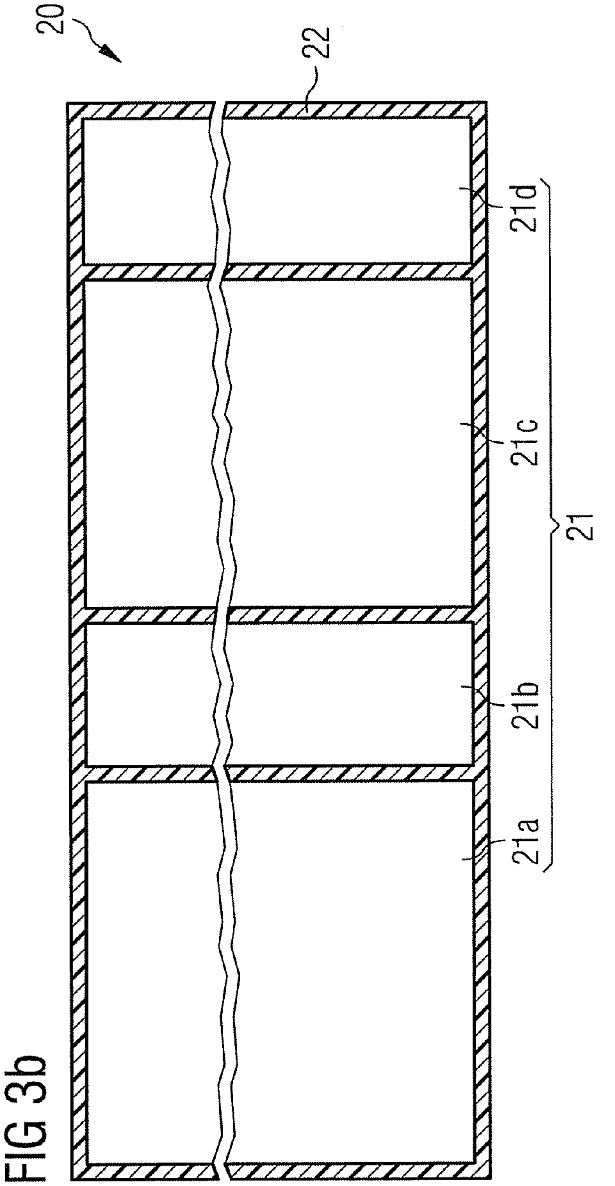
FIG. 3*b* is a top view onto the substrate of the module depicted in FIG. 3*a*.

External connection of the power semiconductor module 120 is provided through flat conductive sheets 11, 12 and 13. The sheets 11 and 12 run parallel and distant from each other at, for example, 0.1 mm to 5 mm, forming a strip line arrangement 15. Optionally, the strip line arrangement 15 may include an insulating sheet 19 arranged between the conductive sheets 11 and 12. To externally connect the phase output power terminal 43, a flat conductive sheet 1 is applied. FIG. 3*b* is a top view along line A-A' of FIG. 3*a* onto the substrate 20 of the module 120 illustrated in FIG. 3*a*. As can be seen, the sections 21*a*, 21*b*, 21*c*, 21*d* of top metal layer 21 are arranged distant from each other.

Figure 4:
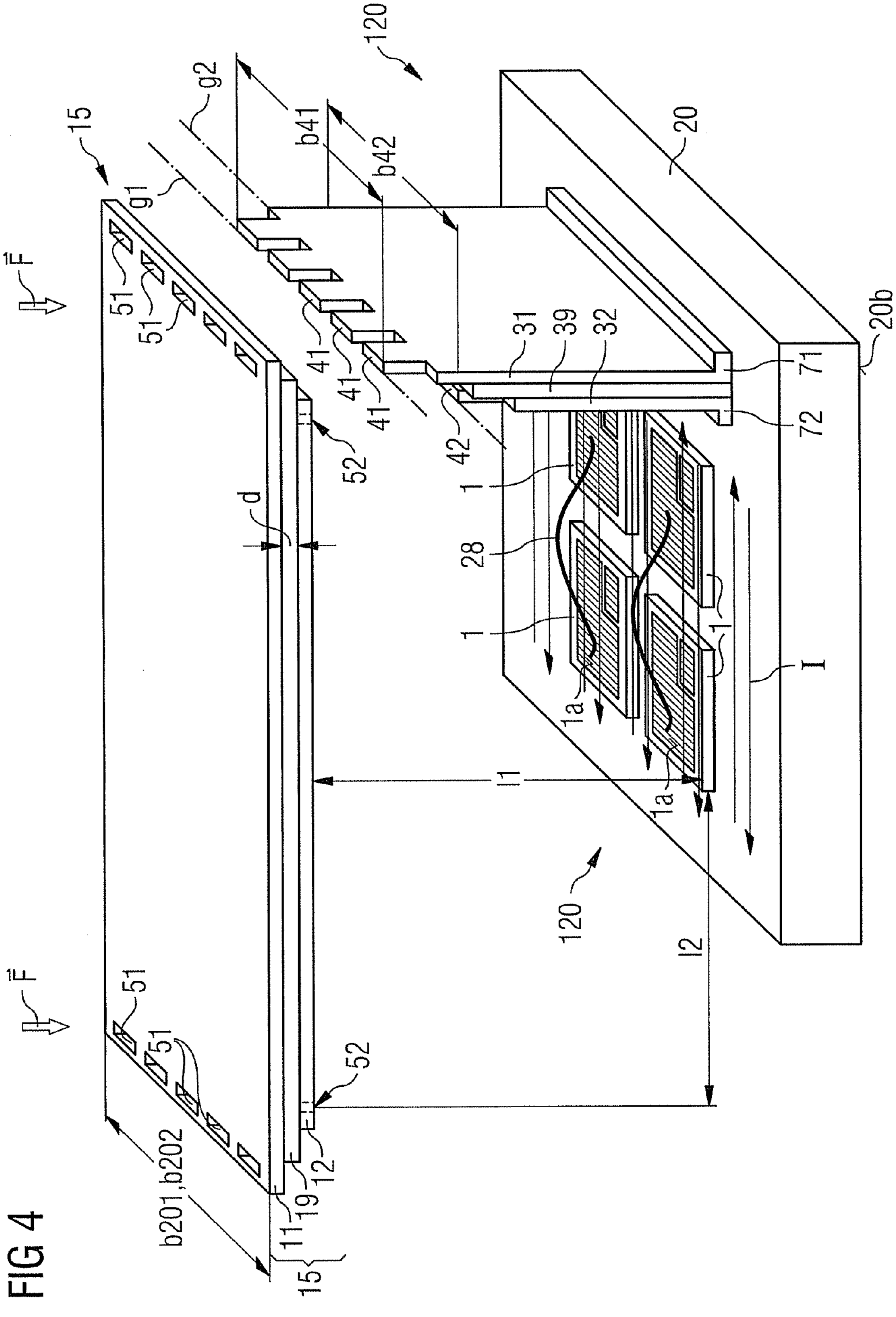
FIG. 4 is perspective view of a power semiconductor arrangement and a strip line.

FIG. 4 is a perspective view of a power semiconductor module 120. The module 120 includes a substrate 20, power semiconductor chips 1 attached to the substrate 20, a connecting lug 31 with plug-like elements 41 at one end and legs 71 at the other end, and a connecting lug 32 with plug-like elements 42 at one end and a joining leg 72 at the other end. The connecting lugs 31, 32 connect the joining legs 71, 72 to the respective plug-like elements 41, 42. With a suitable arrangement of the power semiconductor chips 1, for example, in one or more parallel rows running parallel to a first straight line g1, and a suitable structure of the metal layers on the substrate 20, the main current runs substantially in two parallel but opposite directions. In FIG. 4, these particular directions of the current are represented by arrows 1.

On the substrate 20, a number of power semiconductor chips is arranged on the substrate. Each of the power semiconductor chips 1 includes a first terminal area 1*a* and a second terminal area (arranged on the bottom sides of the power semiconductor chips 1 and, thus, not illustrated in the drawings). The first terminal area 1*a* and the second terminal area may be a drain terminal area or a source terminal area or a collector terminal area or an emitter terminal area or an anode terminal area or a cathode terminal area. All of the first terminal areas 1*a* and all of the second terminal areas are electrically connected to each other, respectively. The numbers of plug-like elements 41 and plug-like elements 42 each are at least two to provide sufficient mechanical stability on one hand and to prevent currents flowing in a direction perpendicular to the direction of the main current (cross currents).

In the strip line arrangement 15, the conductive sheets 11 and 12 include openings 51 and openings 52 (not illustrated in detail in FIG. 4 as they are hidden under the insulating sheet 19 and the conductive sheet 11) matching with the power terminals 41 and 42, respectively. To connect the strip line arrangement 15 to the lugs 31, 32, having plug-like elements 41, 42, the openings 51 and 52 are placed above the plug-like elements 41 and 42, respectively, and a force F from above is applied to the strip line arrangement 15 to press the strip line arrangement 15 against the lugs 31, 32. This causes the plug-like elements 41, 42 to penetrate into the respective openings 51, 52 forming press-fit connections.

As can be seen from FIG. 4, the plug-like elements 41 are arranged successively along the first straight line g1 which runs, for example, parallel to the bottom side 20*b* of the substrate 20. The plug-like elements 42 are arranged successively along a second straight line g2 which runs parallel to the first straight line g1. The plug-like elements 41 extend across a range b41 and the plug-like elements 42 across a range b42 where both ranges have essentially the same size. In directions parallel to the directions of the straight lines g1, g2 the conductive sheets 11 and 12 extend over ranges b201 or b202, respectively. The ranges b201 and b202 are equal to each other and to the ranges b41, b42 in order to avoid cross currents.

In FIG. 4, the right end of the strip line arrangement 15 is connected to the module 120. In the same way, the other end may also include openings 51, 52 as described above to be connected to a further electronic component (not illustrated), for example, a capacitor or a further power semiconductor module. To this, the further electronic component may include plug-like elements such as the plug-like elements 41, 42. The strip line arrangement 15 runs substantially parallel to the substrate 20 and has, in a direction perpendicular to the plane of substrate 20, a distance 11 to the power semiconductor chips 1. Further, the row of power semiconductor chips 1 arranged next to the further electronic component (not illustrated) has, in a direction parallel to the plane of the substrate 20 and perpendicular to the direction of the first straight line g1, a distance 12 to the openings 52 of the lower conductive sheet 12 and to the respective plug-like elements of the further electronic component (not illustrated), if the latter is connected to the strip line arrangement 15.

Figure 5A:
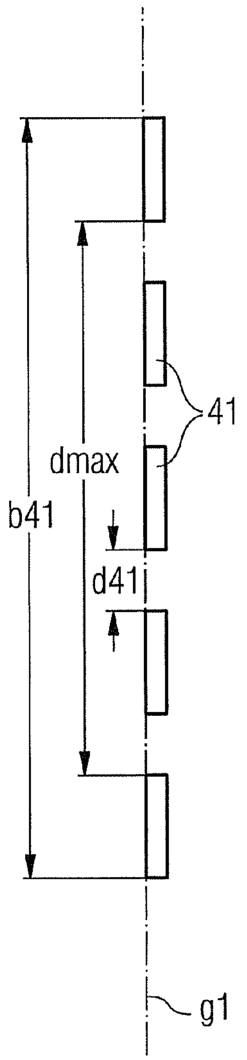
FIG. 5*a* is a top view onto a number of power terminals electrically connected to one another and arranged along a straight line.
Figure 5B:
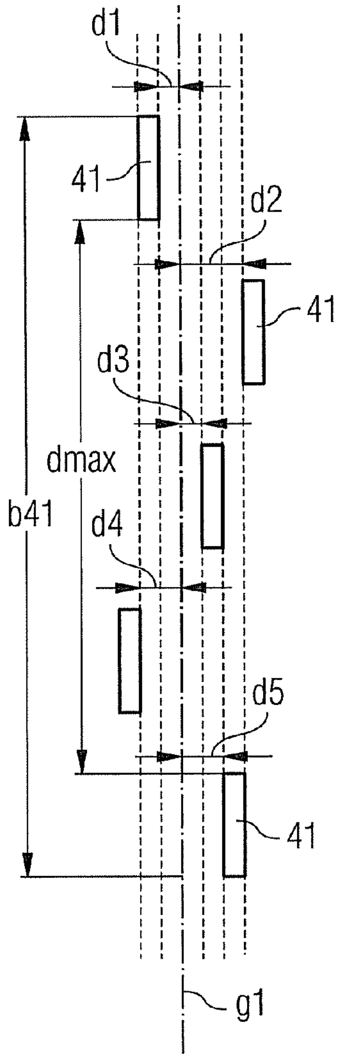
FIG. 5*b* is a top view onto a number of power terminals electrically connected to one another.
Figure 5C:
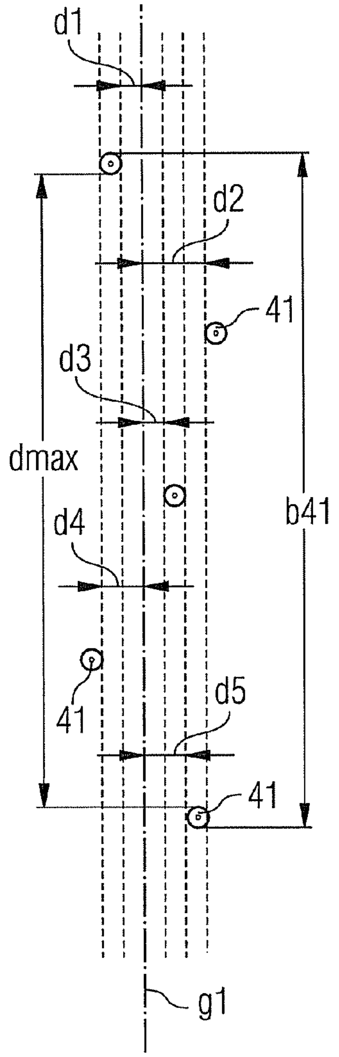
FIG. 5*c* a top view onto a number of power terminals electrically connected to one another.

FIGS. 5*a* to 5*c* illustrate top views of different examples of first plug-like elements 41. FIG. 5*a* illustrates the plug-like element 41 of FIG. 4. The first power terminals 41 are arranged successively on a straight line g1 within a range b41 in a distance d41 from each other to a maximum distance dmax between the first and the last plug-like element. FIG. 5*b* illustrates an arrangement in which the first power terminals 41 are not arranged on a straight line g1, but in distances d1, d2, d3, d4 and d5 perpendicular to the straight line g1. The maximum distance of d1, d2, d3, d4, d5, may be such that it does not interfere with strip line 12 which is parallel to the strip line 11 to be connected to lug 31. The arrangement illustrated in FIG. 5*c* differs from the one illustrated in FIG. 5*b* in that the plug-like elements 41 are formed as thick wires having circular cross sections and a top spike to ease connecting the power semiconductor module to the strip line. Compared to the strip lines of FIG. 4, the conductive sheet connected to the plug-like elements 41 of FIG. 5*c* may include circular bore openings. The distances between the strip lines 11, 12 depend on the insulating strength to be achieved. The smaller the distance between two strip-lines 11, 12 arranged in parallel the lower is the inductance of the strip line arrangement 15 including the strip lines 11, 12.

Figure 6:
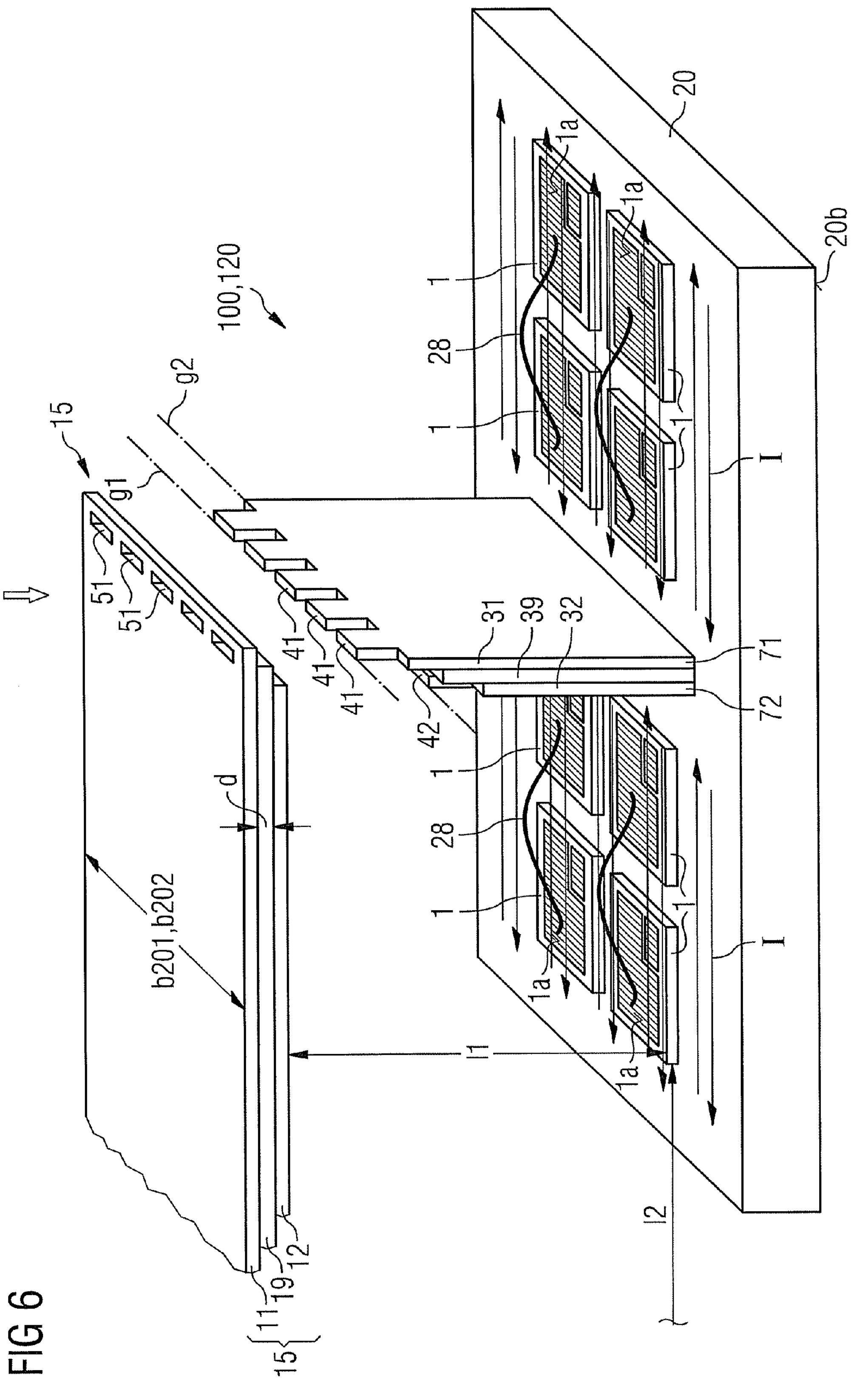
FIG. 6 is a perspective view of a power semiconductor module and a strip line.

In FIG. 4 all power semiconductor chips 1 of the power semiconductor module 120 are arranged on one side of the lugs 31, 32. In FIG. 6, the power semiconductor chips 1 of the power semiconductor module 120 are arranged on both sides of the connecting lugs 31, 32. With reference to FIGS. 4 and 6, a current I flows in the metal layers of the substrate and in the area close to the substrate, wherein the currents I substantially run parallel to a cardinal direction and cross currents are kept to a minimum.

Figure 7:
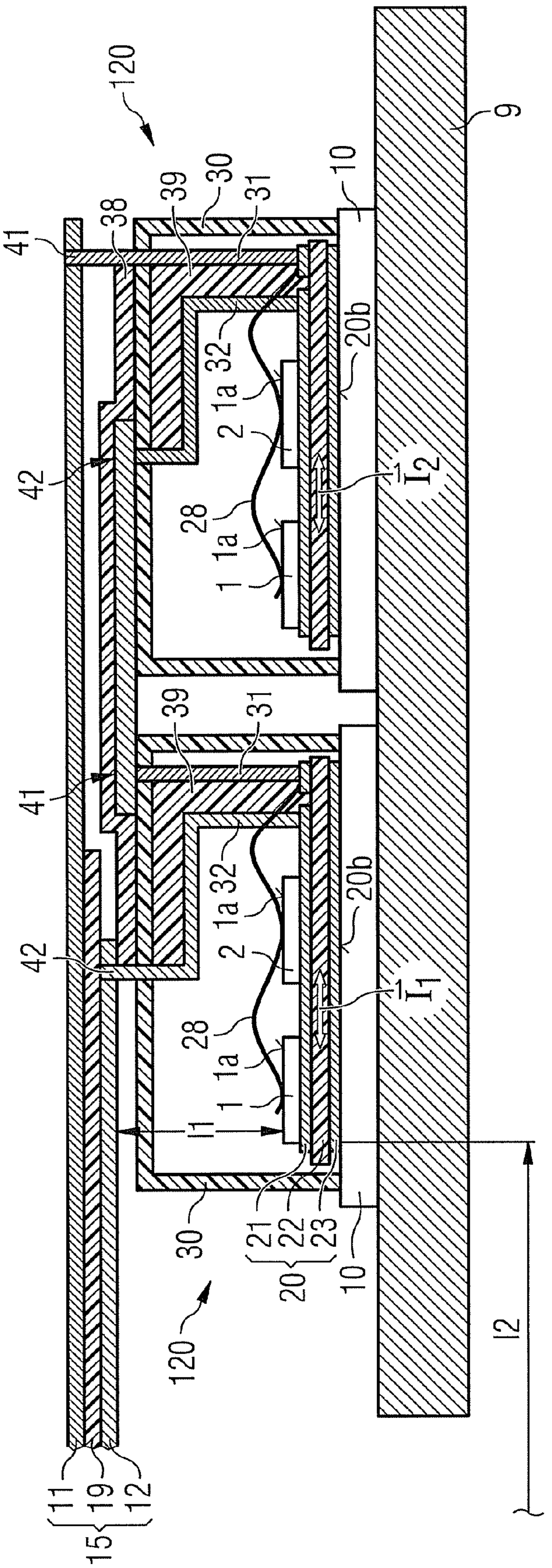
FIG. 7 is a cross sectional view of a power semiconductor arrangement including two identical power semiconductor modules connected in series to one another by use of a strip line.

FIG. 7 is a cross sectional view of a power semiconductor arrangement that include two identical power semiconductor modules 120 connected in series. Each of the power semiconductor modules 120 include, for example, a power semiconductor chip 1 and a free wheeling diode 2 connected thereto. Each of the modules 120 further includes a base plate 10, for example, made of metal, which is pressed against a common heat sink 9 with a heat conducting paste in between if appropriate. Each of the modules 120 may further include a housing cover 30 which together with the respective base plate 10, forms a housing of the modules 120.

Figure 8A:
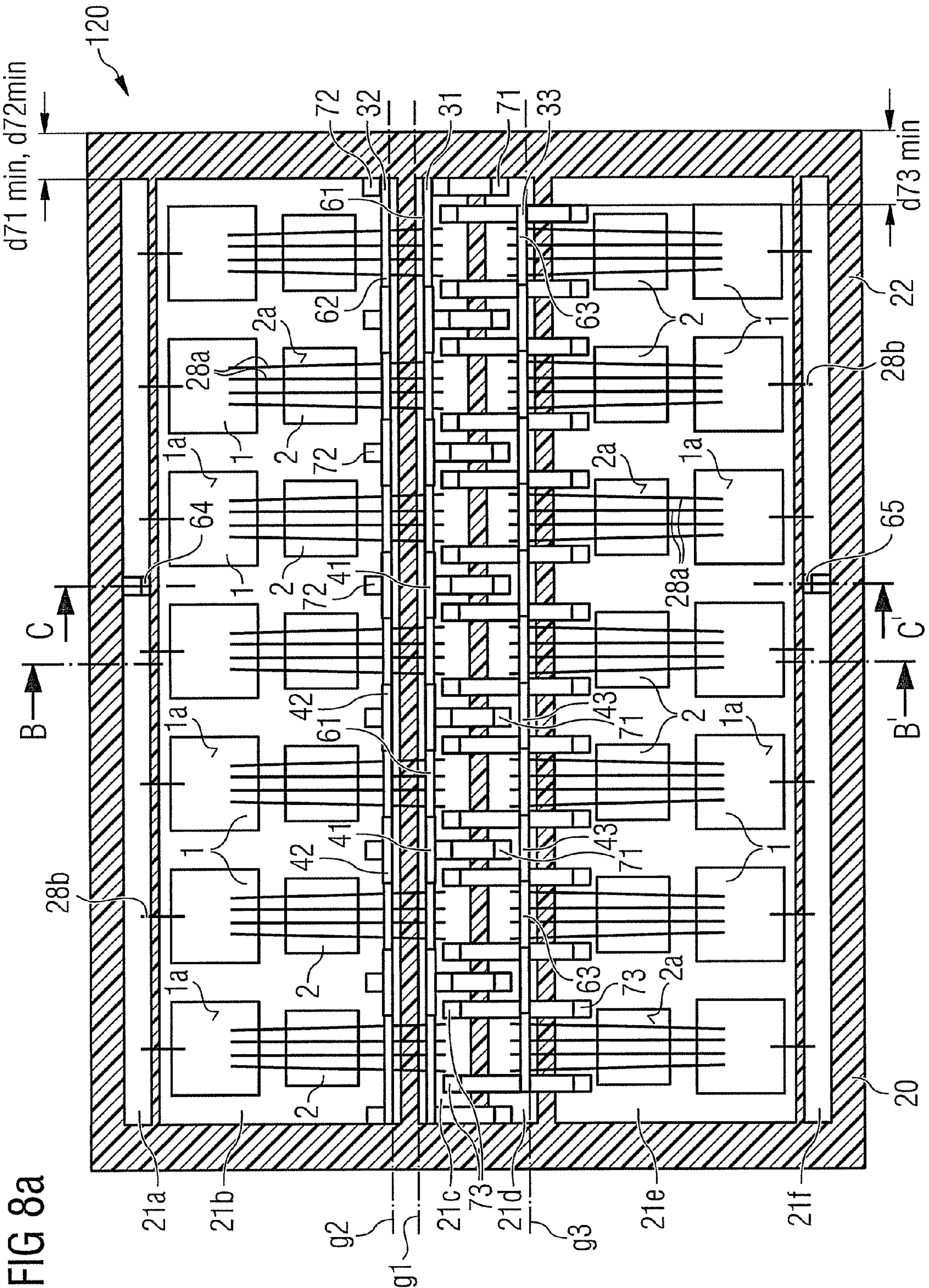
FIG. 8*a* is a top view of a power semiconductor module established by a half bridge module in which the power terminals electrically connected to one another are arranged along straight lines.

FIG. 8*a* is a top view of another embodiment of a power semiconductor module 120. The module 120 includes a substrate 20 with a ceramic layer 22 and a top metal layer 21. Top layer 21 includes sections 21*a*, 21*b*, 21*c*, 21*d*, 21*e* and 21*f* distant from each other. The module 120 includes a half bridge with an upper half bridge leg and a lower half bridge leg. The upper half bridge leg includes seven power semiconductor chips 1 and seven free wheeling diodes 2 where the power semiconductor chips 1 and the free wheeling diodes 2 of the upper half bridge leg are electrically conductive joined with the respective second terminal areas 1*b* and 2*b* (not visible in FIG. 8*a*), to a section 21*b* of top metal layer 21.

Accordingly, the power semiconductor chips 1 and the free wheeling diodes 2 of the lower half bridge leg are electrically conductive joined with the respective second terminal areas 1*b* and 2*b* (not visible in FIG. 8*a*), to a section 21*e* of top metal layer 21. The first terminal areas 1*a*, 1*b* on top of the power semiconductor modules 1 and the freewheeling diodes 2 of the upper half bridge leg are connected by bonding wires 28 to a section 21*c* of top metal layer 21. The first terminal areas 1*a*, 1*b* on top of the power semiconductor modules 1 and the freewheeling diodes 2 of the lower half bridge leg are connected by bonding wires 28 to a section 21*d* of top metal layer 21. The power semiconductor chips 1 in the upper half bridge leg include control terminal areas which are arranged on top of the semiconductor chips 1 and electrically connected by bonding wires 28*b* to a section 21*a* of top metal layer 21. Accordingly, the power semiconductor chips 1 in the lower half bridge leg include control terminal areas which are arranged on top of the semiconductor chips 1 and electrically connected via bonding wires 28*b* to a section 21*f* of top metal layer 21.

The power semiconductor module 120 further includes power input terminals 141, 142 and a power output terminal 143 for external connection. Power input terminal 141 is electrically connected to section 21*d*, power input terminal 42 to section 21*b*, and phase output terminal 143 to sections 21*c* and 21*e*. The respective electrical connections are established by connecting lugs 31, 32 and 33, respectively. The lugs 31, 32 and 33 include joining legs 71, 72 and 73 which are directly joined to the respective sections 21*c*, 21*b* and 21*c*/21*e*, respectively.

Alternatively, joining legs may be directly joined to a terminal area 1*a*, 2*a* arranged on top of a power semiconductor chip 1 and/or a free wheeling diode 2. As joining techniques soldering, electrically conductive gluing, or a low temperature joining technique (LTJT) using a silver paste, are applicable. Parts 61, 62 and 63 of the lugs 31, 32 and 33 form bus bars extending parallel to the substrate 20. The entirety of first joining legs 71 includes a minimum distance d71min to an edge of the substrate 20, and the entirety of second joining legs 72 includes a minimum distance d72min to an edge of the substrate 20. The entirety of third joining legs 73 includes a minimum distance d73min to an edge of the substrate 20. For electrically connecting the control terminal areas of the power semiconductor chips 1, a terminal 64 connected to section 21*a* and a terminal 65 connected to section 21*f* are provided.

Figure 8B:
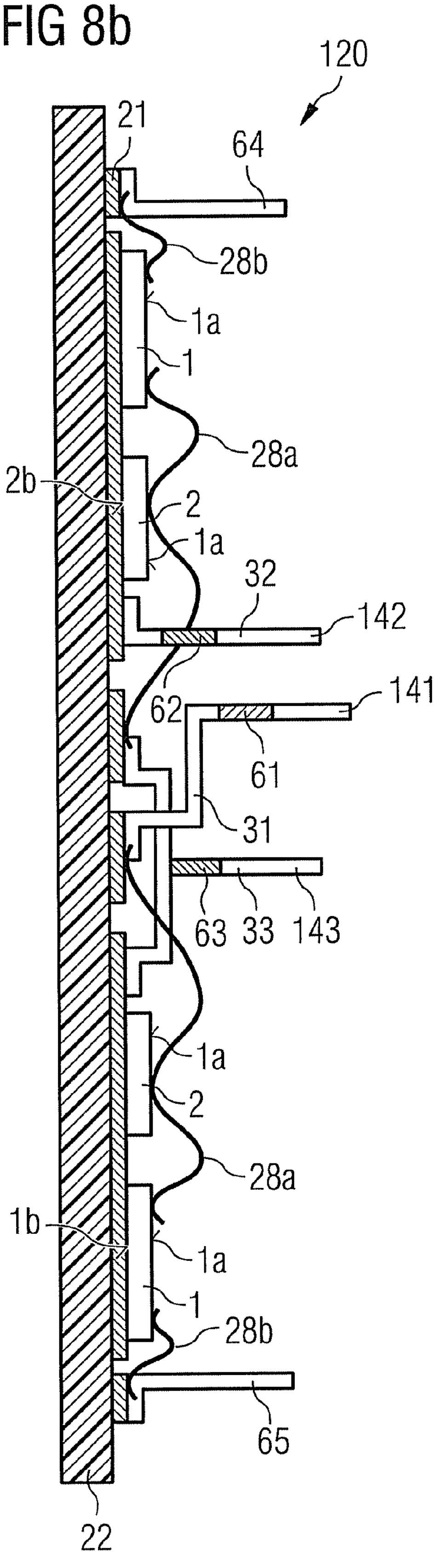
FIG. 8*b* is a cross sectional view of the power semiconductor module of FIG. 8*a* along line B-B'.
Figure 8C:
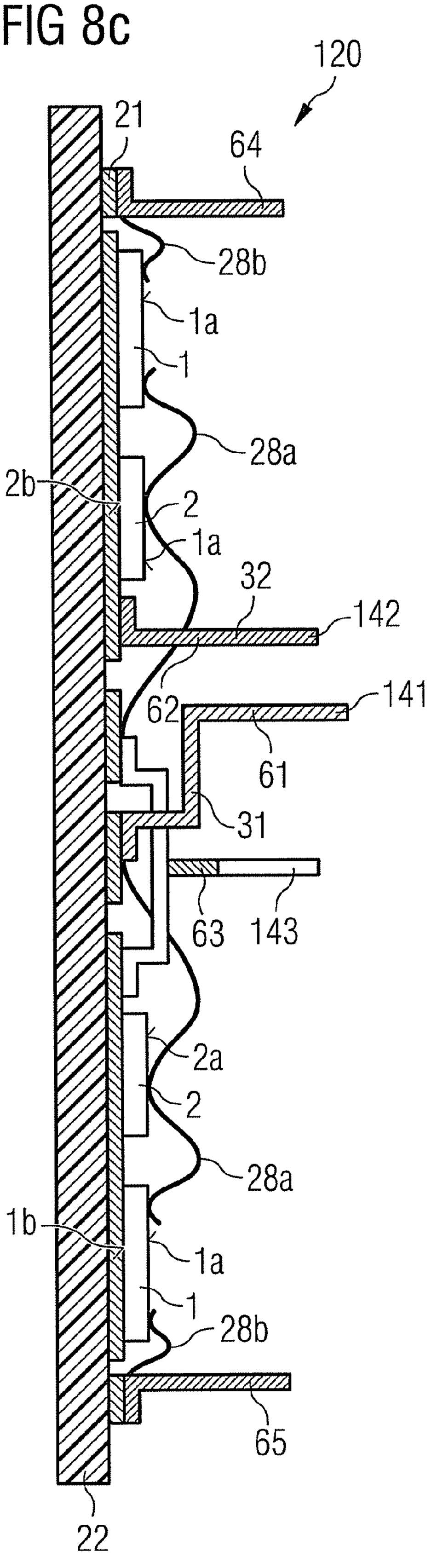
FIG. 8*c* is a cross sectional view of the power semiconductor module of FIG. 8*a* along line C-C'.
Figure 8E:
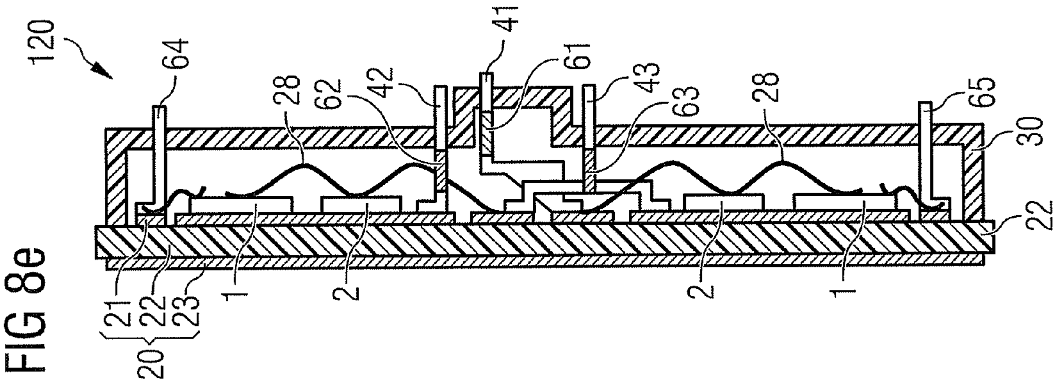
FIG. 8*e* is a cross sectional view of the power semiconductor module of FIG. 8*d* along line B-B'.
Figure 8D:
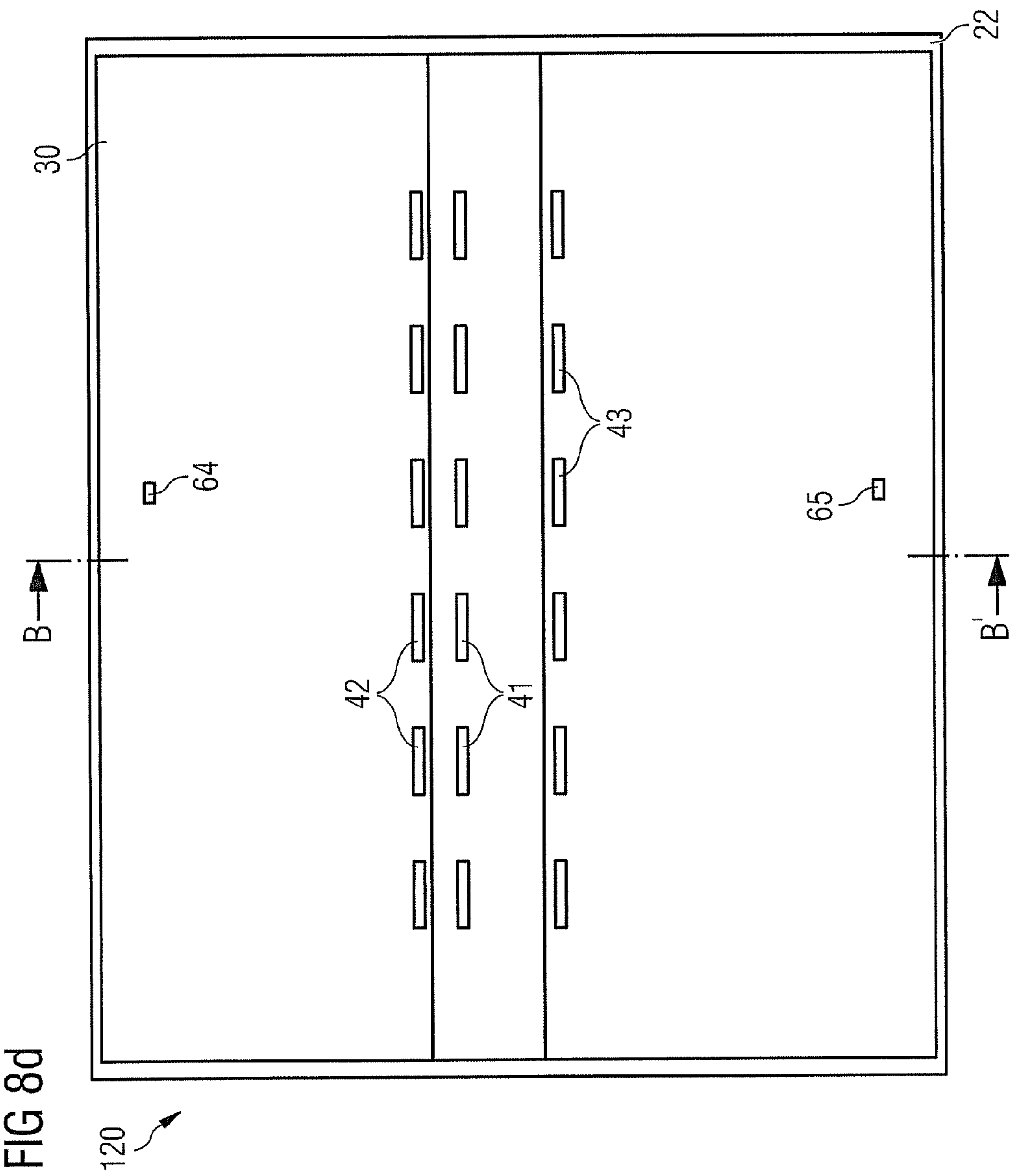
FIG. 8*d* is a top view of the power semiconductor module of FIG. 8*a* with the housing cover attached to the module.

FIGS. 8*b* and 8*c* are cross sectional views along lines B-B' and C-C' of FIG. 8*a*. In these views, also the second terminal areas 1*b*, 2*b* of the power semiconductor chips 1 and the free wheeling diodes 2, respectively, can be seen. FIG. 8*d* is a top view of the module of FIG. 8*a*. However, in FIG. 8*d* a housing cover 30 attached to the module 120 is illustrated. The housing cover 30 includes openings through which the power terminals 41, 42, 43 and the control terminals 64, 65 protrude above the housing cover 30. The protrusion of the terminals 41, 42, 43, 64, 65 can be seen in FIG. 8*e*, which is a cross sectional view of the module 120 along line B-B' of FIG. 8*d*.

Figure 9:
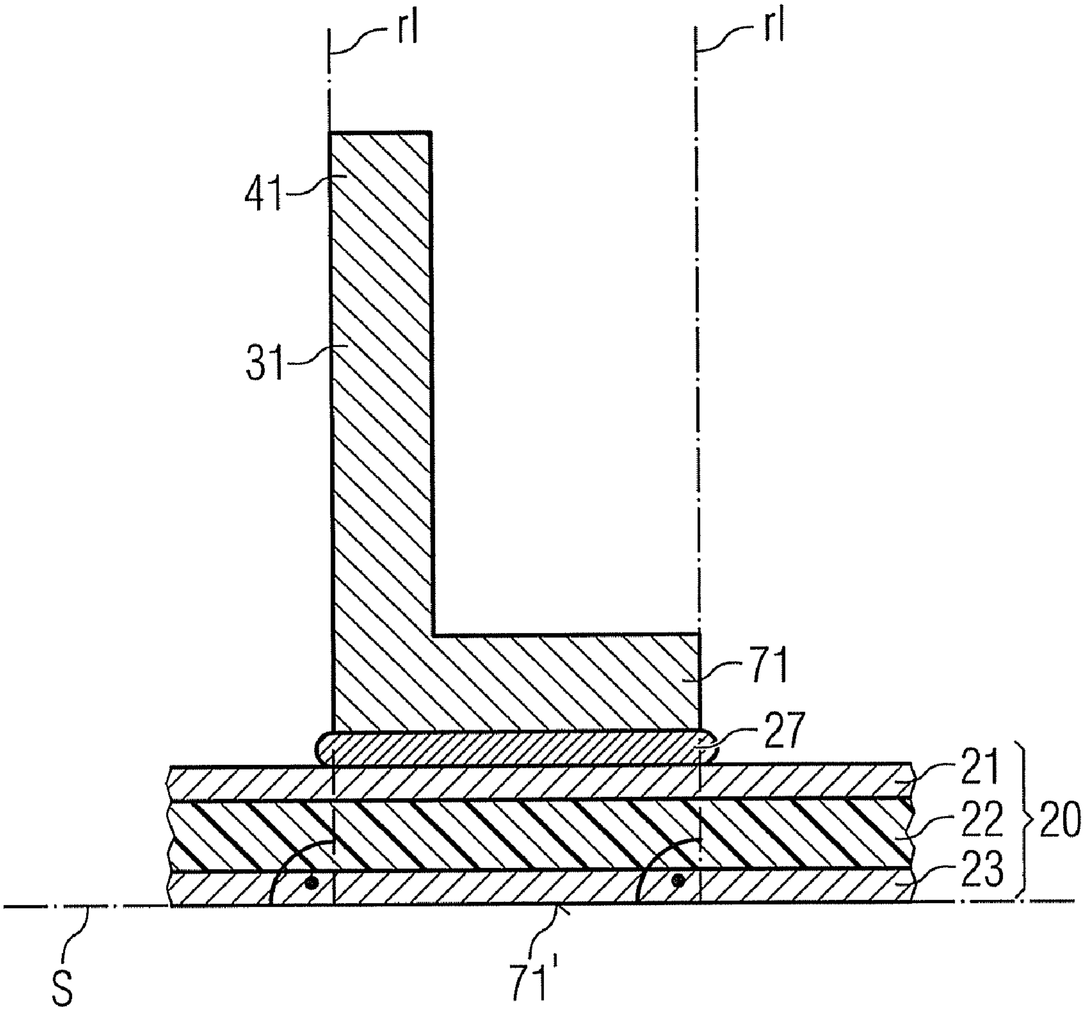
FIG. 9 is a cross sectional view of a power terminal electrically connected to a top metal layer of a substrate by use of a connecting lug.

FIG. 9 illustrates a joining leg 71 and a lug 31 connecting the joining leg 71 to a power terminal 41. The leg 71 is directly soldered to the top metal layer of a substrate 20 including metal layers 21, 23 and a ceramic layer 22 arranged between the metal layers 21 and 23.

Figure 10:
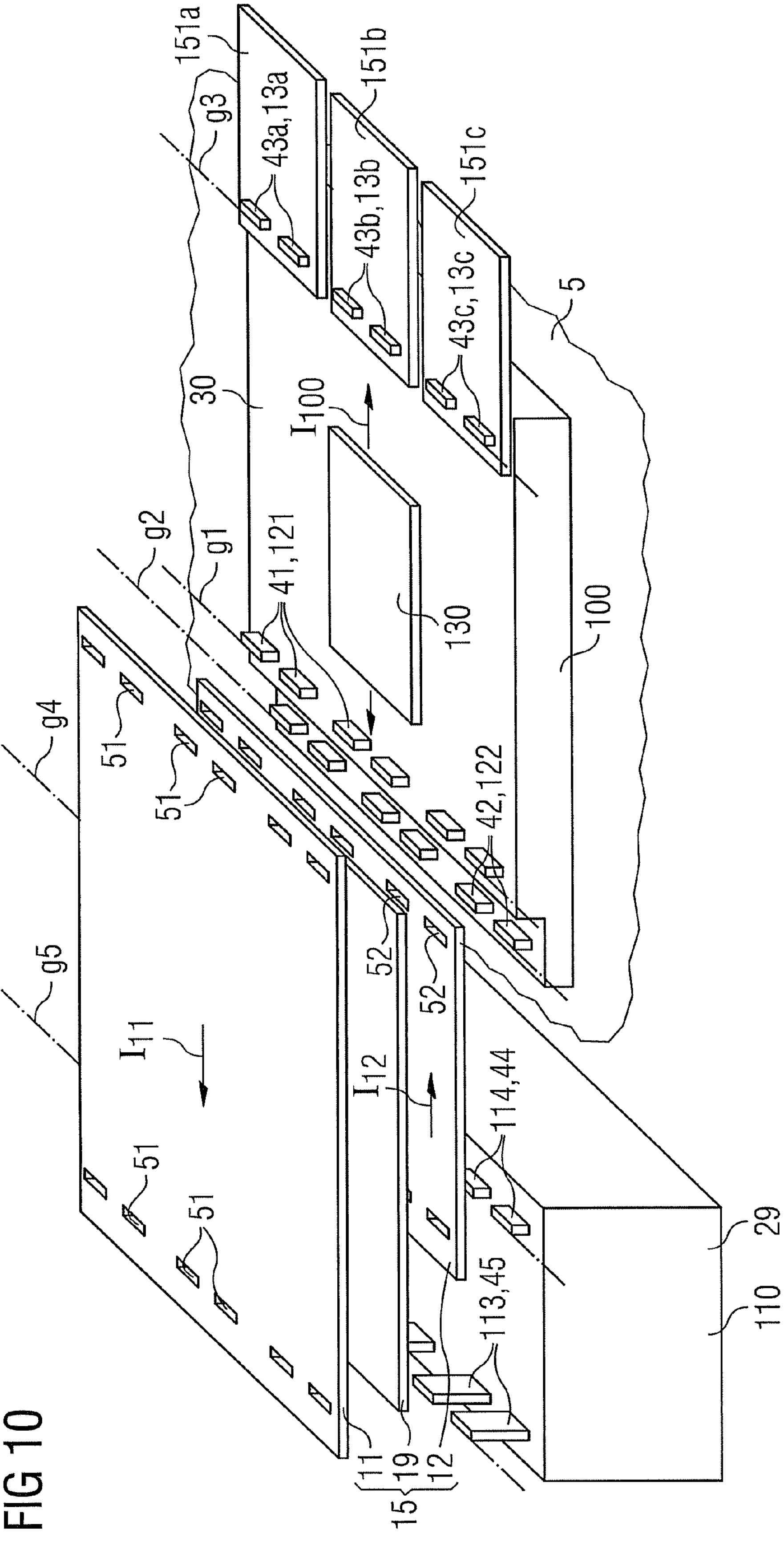
FIG. 10 is perspective view of a power semiconductor arrangement including a power semiconductor module and a DC-link capacitor to be connected to each other by use of a strip line.

FIG. 10 illustrates a power semiconductor arrangement including a power semiconductor module 100 to be connected to a strip line arrangement 15. The power semiconductor module 100 may include a three-phase rectifier module. A control unit 130 for controlling the module 100 is attached to an outside of a housing cover 30. The substrate of the power semiconductor module 100 is arranged opposite to the control unit. The module 100 includes plug-like elements 41 and plug-like elements 42 as terminals of the module 100 for its connection to the DC-link capacitor module 110 (as illustrated in FIG. 2) which has plug-like elements 44, 45. The plug-like elements 45 and plug-like elements 46 are arranged with respect to a straight line g4 or a straight line g5, respectively, both lines being parallel with respect to lines g1 and g2.

The strip line arrangement 15 includes, as already outlined above, conductive metal sheets 11, 12 distant from each other, and an insulation layer 19 arranged between the conductive metal sheets 11, 12. The conductive metal sheet 11 connects plug-like elements 42 and 44, the conductive metal sheet 12 to electrically connect power terminals 41 and 45. To ease assembly and to provide improved insulation, the housing cover 30 of the power semiconductor module 100 includes a step so that the plug-like elements 41 are located at a different level as the plug-like elements 42. The plug-like elements 44 and the plug-like elements 45 may be arranged in a similar manner as described above with respect to power terminals 41, 42. The openings 51 and 52 provided in the flat conductive sheets 11 and 12 establish together with the respective plug-like elements 41, 42, 44, 45, press-fit contacts as described above.

The module further includes three phase output power terminals having plug-like elements 43*a*, 43*b*, 43*c*. Metal sheets 151*a*, 151*b* and 151*c* are electrically connected to the respective phase output power terminals 43*a*, 43*b* and 43*c* through press-fit contacts as described above.

In such an arrangement, the inductance of the arrangement scales down with rising current through the power semiconductor module 100 and the strip lines 11 and 12. If $I_{max}$ is the maximum current through the power semiconductor module 100, which may be twice the nominal (rated) current of the power semiconductor module 100, the inductance L of the arrangement may be less than, for example, $10^{-5}$ VS/$I_{max}$. The inductance L is mainly determined by a distance l which is the sum of the distances l1 and l2 as described in FIG. 4:

$$l=l1+l2$$

between the power semiconductor module(s) 100 and the capacitor(s) 110. An upper limit of the ratio d/b, where d is the distance between the strip conductive sheets 11 and 12, and b is the width of the conductive sheets, for example, in FIG. 4*b*=b42, in FIG. 6*b*=b201=b202, may be, for example, calculated as follows:

$$\frac{d}{b} < 10^{-5} \cdot \frac{V \cdot s}{I_{max} \cdot l \cdot \mu 0};$$

$\mu 0=4 \cdot Pi \cdot 10^{-7}$ V·s/(A·m) is the permeability of vacuum, with Pi=3,1415.

Figure 11:
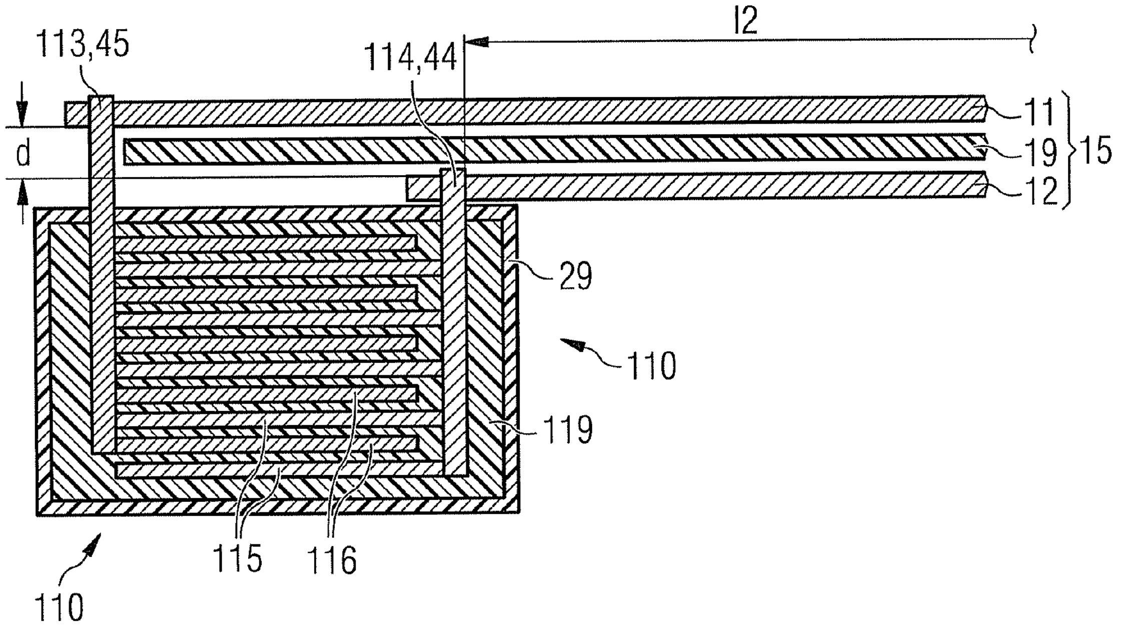
FIG. 11 is a cross sectional view of a DC-link capacitor including first capacitor electrodes electrically connected to one another and second capacitor electrodes electrically connected to one another.
Figure 12:
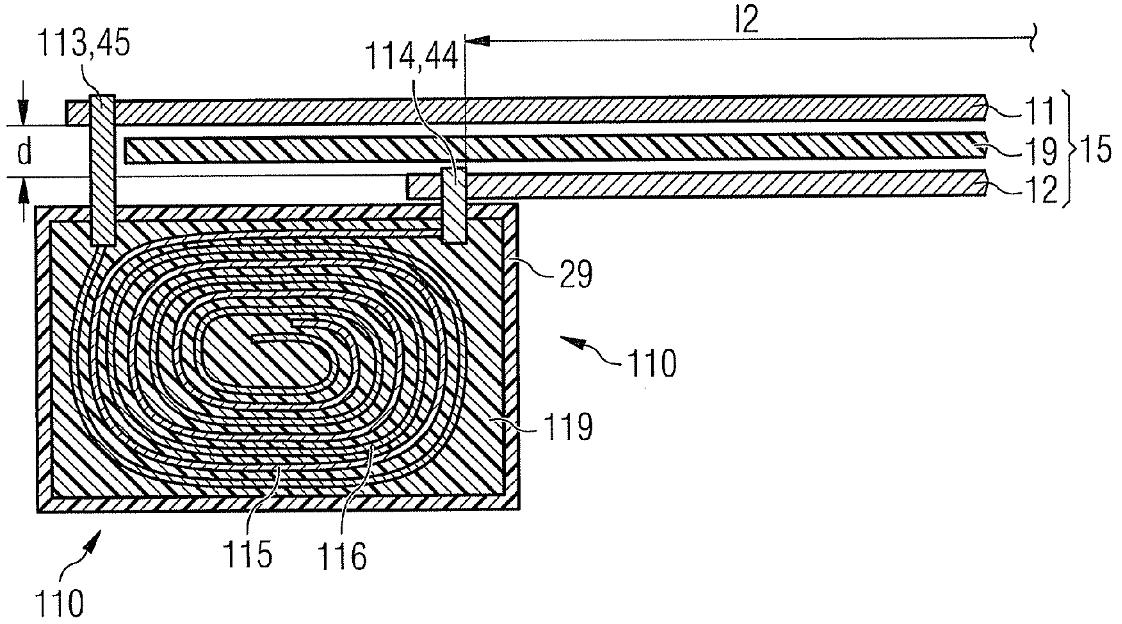
FIG. 12 is a cross sectional view of a DC-link capacitor module including a pair of wound-up capacitor electrodes.

FIG. 11 is a cross sectional view of a capacitor module 110 as described with reference to FIGS. 1 and 2. The module 110 includes capacitor electrodes 115 electrically connected to the plug-like elements 44 and capacitor electrodes 116 connected to the plug-like elements 45 where the capacitor electrodes 115, 116 are arranged alternately and successively. The interior of the housing 29 may be potted with a dielectric 119, for example, silicone or epoxy. Another capacitor module 110 is illustrated in FIG. 12 where the first electrode 115 and the second electrode 116 are wound up together.

Figure 13A:
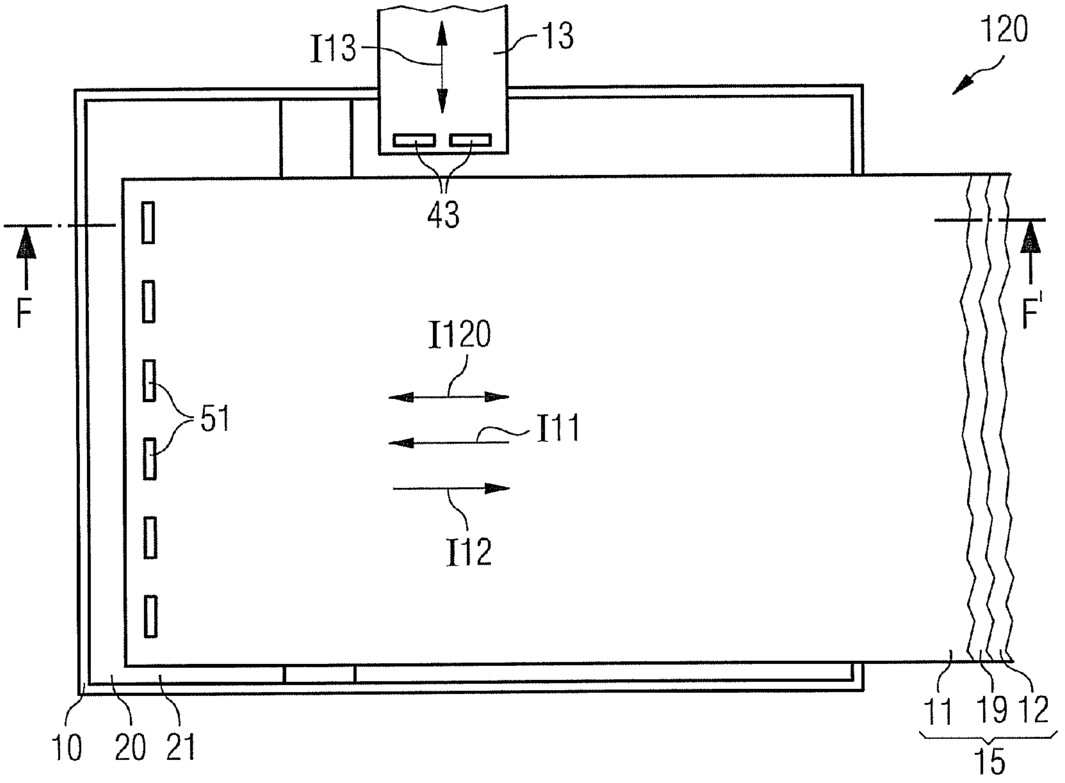
FIGS. 13*a* and 13*b* illustrate a power semiconductor module including a half bridge, a strip line electrically connected to the power supply terminals of the module, and a conductive sheet connected to the phase output of the module.
Figure 13B:
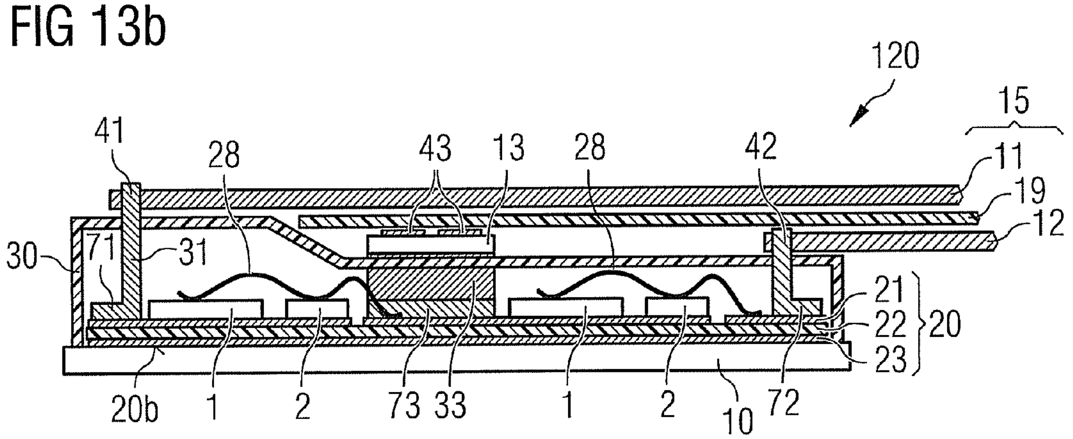

FIGS. 13*a* and 13*b* illustrate a power semiconductor module 120 where FIG. 13*b* is a cross sectional view of the module 120 along line F-F' of the top view represented by FIG. 13*a*. In the module 120, currents I11 and I12 flowing substantially parallel in the conductive sheets 11 and 12, but having opposite directions lead to a resulting current I120 by superposition. A current I13 in a conductive sheet 13 connected to the phase output terminals 43 the cardinal heading that is substantially perpendicular to the cardinal headings of the current I120.

Figure 14A:
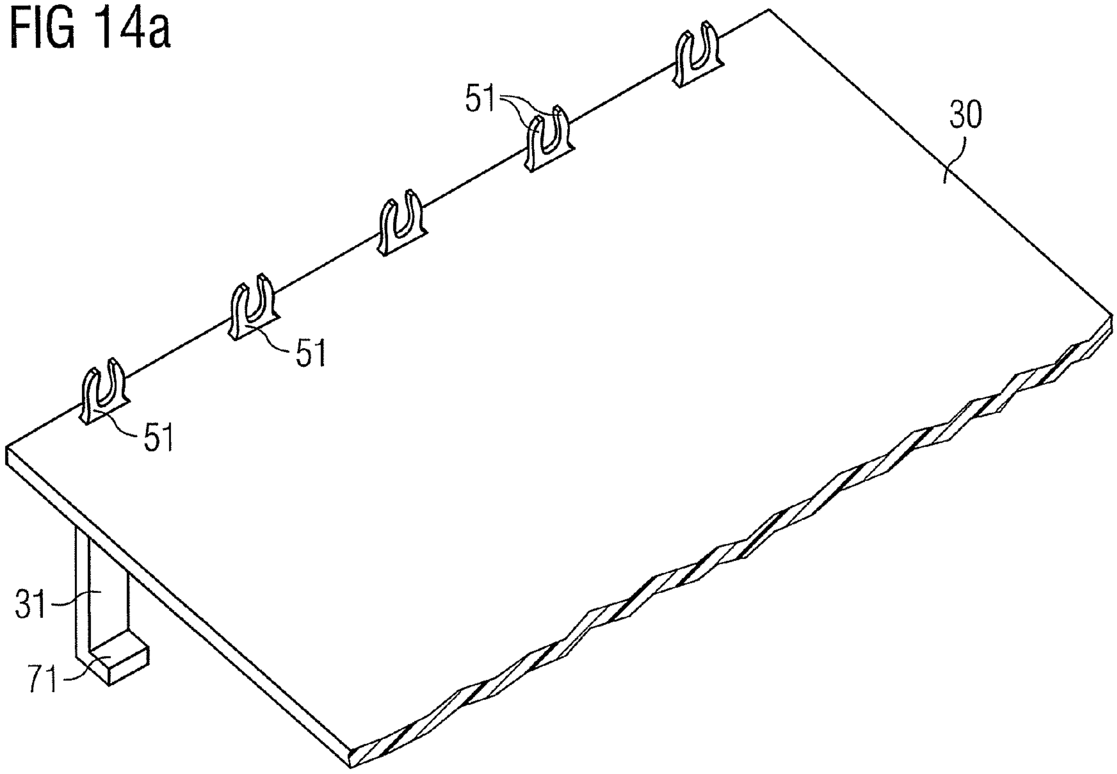
FIG. 14*a* is a perspective view of a section of a housing cover of a power semiconductor module including spring clips.
Figure 14B:
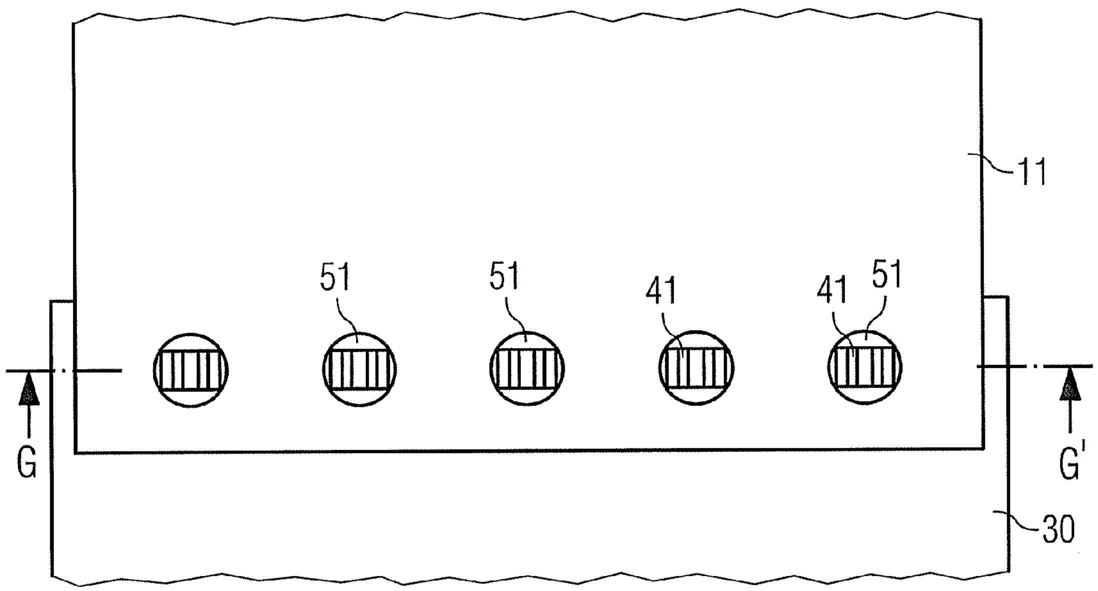
FIG. 14*b* is a top view of the housing cover and the spring clips of FIG. 14*a*.
Figure 14C:
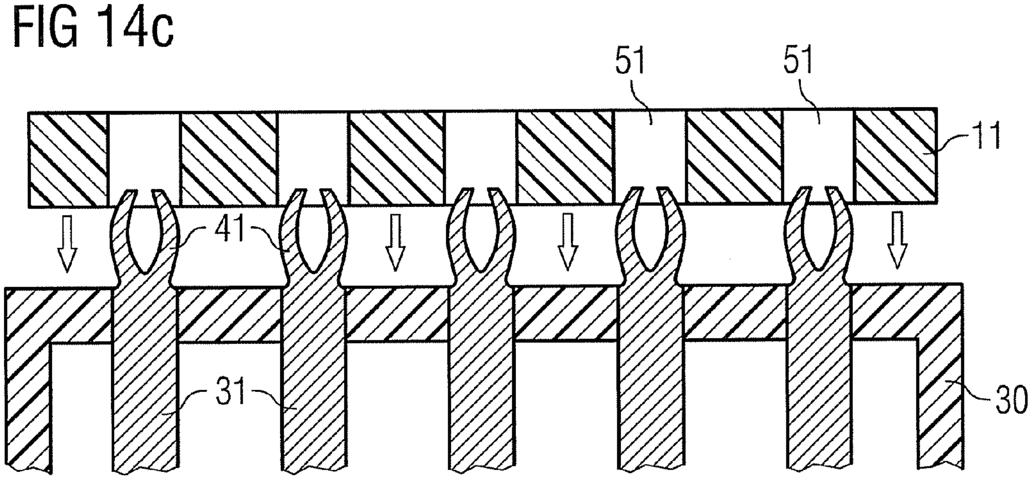
FIG. 14*c* is a cross sectional view of the arrangement of FIG. 14*b* along line G-G'.

FIG. 14*a* is a perspective view of a section of a housing cover 30 of a power semiconductor module. A number of power terminals 51 arranged substantially along a straight line extends through the housing cover 30. The power terminal includes spring clips 51, each including two spring legs 51*a*, 51*b*. Each of the spring clips 51 is electrically connected to a joining leg 71 by use of a connecting lug 31. In FIG. 14*b*, which is a top view of the housing cover 30, a conductive sheet 11 of a strip line arrangement is pushed with openings 51 against the housing cover 30, such that the openings 51 match with spring clips 51. FIG. 14*c* is a cross sectional view along line G-G' of FIG. 14*b*. After completely pushing the openings 51 on the spring clips 41, the power semiconductor module is electrically connected to the conductive sheet over almost the whole width of the strip line arrangement, thus, reducing cross currents.

Alternatively to the spring clip connection illustrated in FIGS. 14*a*-14*c*, other press-fit connections including, for example, a fork structure, an eye structure, a twisted structure, a bolt type structure, or a rivet type structure are applicable. Different from the arrangements illustrated above, also low profile modules may be used where power terminals are arranged on opposite side walls of the housing of the power semiconductor module.

For example, a press fit connection between a drilled through hole and a connector pin may be made by pressing an oversized pin into the drilled through hole. The essential feature is that the cross section of the pin must be greater than the diameter of the hole. This results in an overlapping of material at the pin and drilled through hole, which must be taken up by deformation of either the pin or the hole. The deformation may be elastic or non elastic. The upper side of pin 41 may be part of or may be connected to a lug 31 as illustrated, for example, in FIG. 4.

Figure 15A:
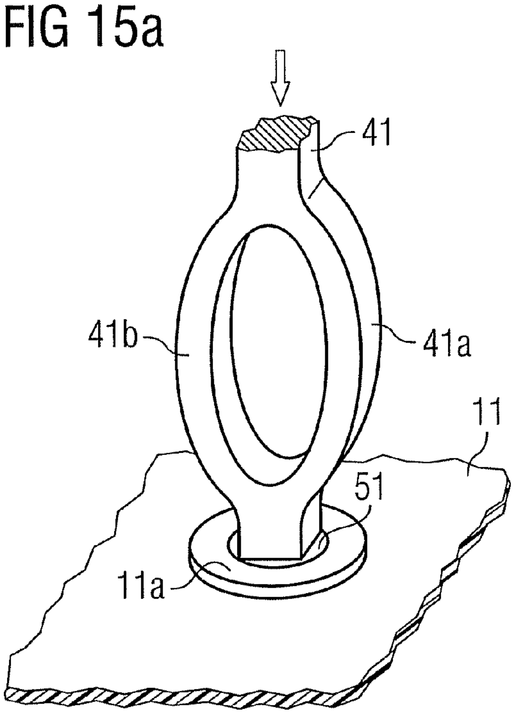
FIG. 15*a* is a perspective view of a press fit connection including a pin including a spring-like element is inserted into a through hole.
Figure 15B:
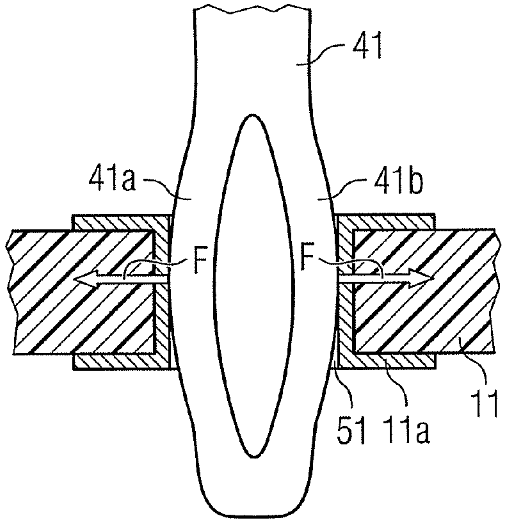
FIG. 15*b* is a vertical cross sectional view of press fit connection of FIG. 15*a*.
Figure 15C:
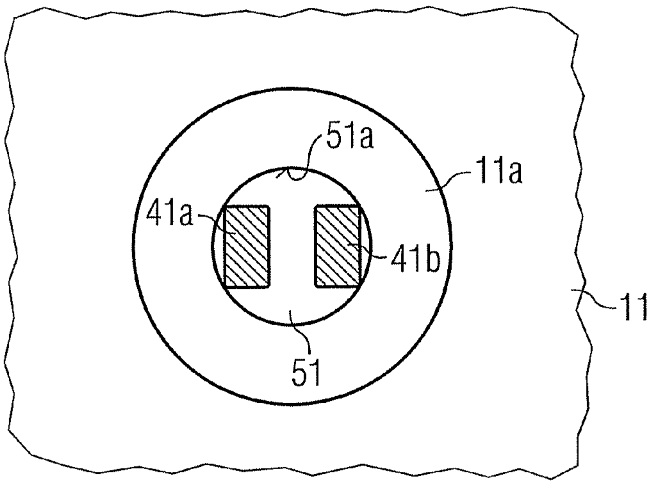
FIG. 15*c* is a horizontal cross sectional view of the press fit connection of FIG. 15*b*.

FIG. 15*a* illustrates an example of a press fit connection between a compliant pin 41 and a through hole 51 of a strip line 11. The pin 41 two branches 41*a*, 41*b* forming a spring-like element. When inserted into the through hole 51, the branches 41*a*, 41*b* are compressed elastically. Due the compression, as can be seen from FIG. 15*b*, a tension F effects the inner side wall of the through hole 51 and establishes a tight connection between the pin and the through hole 51. Optionally, the through hole 51 may be reinforced by an eye 11*a*. From the horizontal cross sectional view illustrated in FIG. 15*c* it can be seen that—due to the elasticity of the spring like element formed by the branches 41*a*, 41*b*—there will be no significant deformation of the inner side wall 51*a* of through hole 51.

Figure 16A:
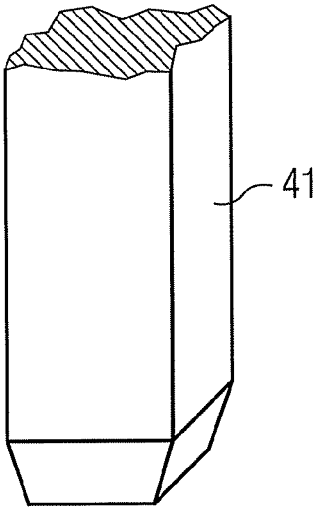
FIG. 16*a* is a perspective view of a solid pin.
Figure 16B:
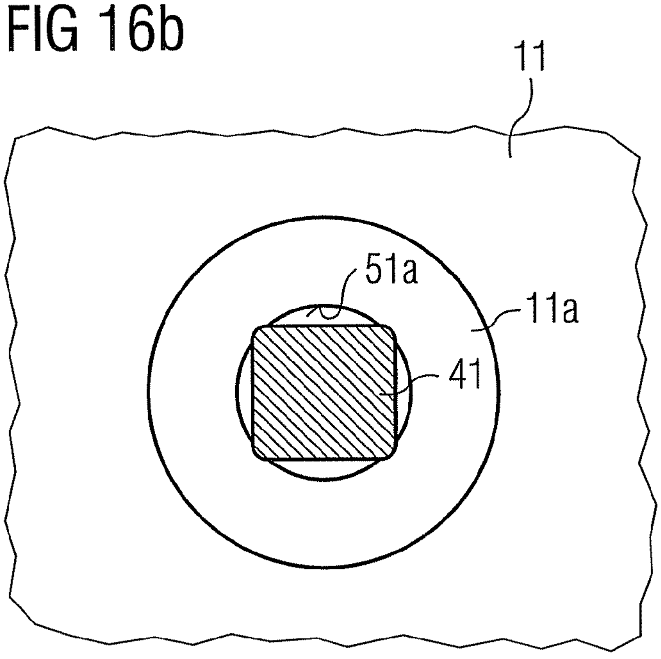
FIG. 16*b* is a horizontal cross sectional view of a press fit connection according to the view of FIG. 15*c*, where a solid pin is used instead of a spring-like element.

Alternatively, instead of a compliant pin a solid pin 41 as, for example, illustrated in FIG. 16*a* may be used. To form a tight connection between the pin 41 and the strip line 11 the solid pin 41 deforms the side wall 51*a* of the through hole 51, which can be seen from the horizontal cross sectional view in FIG. 16*b*.

Although various exemplary embodiments have been disclosed, it will be apparent to those skilled in the art that various changes and modifications can be made which will achieve some of the of the without departing from the spirit and scope of the invention. It will be obvious to those reasonably skilled in the art that other components performing the same functions may be suitably substituted. Such modifications to the inventive concept are intended to be covered by the appended claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor arrangement comprising:

a power semiconductor chip electrically connected to a first set of plug-like elements with at least two plug-like elements; and a sheet metal strip line comprising a set of openings receiving the set of plug-like elements;

wherein the set of openings in the sheet metal strip line and the set of plug-like elements establish a press fit connection; and wherein the plug-like elements of the first set are electrically conductively coupled to one another.

2. The semiconductor arrangement of claim 1, further comprising a substrate with at least one metallization layer carrying the power semiconductor chip, where the set of plug-like elements is mounted on the metallization layer.

3. The semiconductor arrangement of claim 1, wherein the plug-like elements comprise one of a group comprising a pin type structure, fork type structure, an eye type structure, a bolt type structure, and a rivet type structure.

4. The semiconductor arrangement of claim 1, wherein the plug-like elements of the set are arranged along a straight line.

5. The semiconductor arrangement of claim 2, wherein the plug-like elements are directly soldered, welded, bonded, or electrically conductive glued to a portion of the metallization layer of the substrate.

6. The semiconductor arrangement of claim 2, wherein the plug-like elements are formed by a comb-shaped structure at one end of a lug, where the lug is soldered, welded, bonded, or electrically conductive glued to a portion of the metallization layer of the substrate.

7. The semiconductor arrangement of claim 1, further comprising a further set of plug-like elements with at least two plug-like elements at least one further power semiconductor chip arranged on the substrate, where each power semiconductor chip comprises a first and a second load terminal, each of the first load terminals being connected to the set of plug-like elements and each of the second load terminals being connected to a further set of plug-like elements.

8. The semiconductor arrangement of claim 7, further comprising a further sheet metal strip line comprising a further set of openings receiving the further set of plug-like elements, the further set of openings and the further set of plug-like elements establishing a press fit connection, wherein the first sheet metal strip line and the further sheet metal strip line are arranged in parallel.

9. The semiconductor arrangement of claim 8, wherein the one sheet metal strip line and the further sheet metal strip line are separated by an insulator sheet.

10. The semiconductor arrangement of claim 9, wherein the one sheet metal strip line, the further sheet metal strip line and the insulator sheet are arranged and applied with currents such that the respective currents in the sheet metal strip lines flow in opposite directions.

11. The semiconductor arrangement of claim 10, wherein the one sheet metal strip line, the further sheet metal strip line and the insulator sheet are arranged such that their resulting inductance is lower than the inductance of each one of a single sheet metal strip line.

12. The semiconductor arrangement of claim 7, wherein a power semiconductor chip comprises one of a group comprising a single power transistor, a transistor half-bridge, a three-phase-bridge, and a free-wheeling diode.

13. The semiconductor arrangement of claim 1, further comprising a further electronic component comprising a first load terminal being electrically connected to a third set of plug-like elements, wherein the first sheet metal strip line comprises a third set of openings receiving the third set of plug-like elements thus establishing a press fit connection between the semiconductor chip and the further electronic component.

14. The semiconductor arrangement of claim 13, wherein the further electronic component is a block capacitor.

15. The semiconductor arrangement of claim 13, wherein the further electronic component is a control circuitry for the power semiconductor chip or power semiconductor chips.

16. A semiconductor arrangement comprising:

a semiconductor substrate having at least one patterned metallization layer;

a power semiconductor chip being arranged on the metallization layer and comprising at least one first load terminal and at least one second load terminal, the first load terminal being connected to a first set of plug-like elements, the second load terminal being connected to a second set of plug-like elements;

a further electronic component having at least one first load terminal and one second load terminal, the first load terminal being connected to a third set of plug-like elements, the second load terminal being connected to a fourth set of plug-like elements;

a first sheet metal strip line comprising a first set of openings receiving the first set of plug-like elements, and a third set of openings receiving the third set of plug-like elements; and a second sheet metal strip line comprising a second set of openings receiving the second set of plug-like elements, and a fourth set of openings receiving the fourth set of plug-like elements;

wherein the openings in the sheet metal strip lines and the plug-like elements establish a press fit connection; and wherein the sheet metal strip lines being arranged in parallel and applied with currents such that the respective currents in the sheet metal strip lines flow in opposite directions.

17. The semiconductor arrangement of claim 16, wherein the further electronic component is a block capacitor.

18. The semiconductor arrangement of claim 16, wherein the further electronic component comprises a further substrate carrying at least one further semiconductor chip comprising a first and a second load terminal which is connected to the third set of plug-like elements and to the fourth set of plug-like elements respectively.

19. The semiconductor arrangement of claim 16, wherein the plug-like elements comprise one of a group comprising a pin type structure, fork type structure, eye type structure, bolt type structure, and rivet type structure.

20. The semiconductor arrangement of claim 16, wherein the plug-like elements are soldered, welded, bonded, or electrically conductive glued to a portion of the metallization layer of the substrate.

21. The semiconductor arrangement of claim 16, wherein the plug-like elements are formed by a lug comprising a comb-shaped structure at one end, where the lug is soldered, welded, bonded, or electrically conductive glued to a portion of the metallization layer of the substrate.

22. The semiconductor arrangement of claim 16 comprising least one further power semiconductor chip being arranged on the metallization layer and comprising at least one first load terminal and at least one second load terminal, the first load terminals being connected to the first set of plug-like elements, the second load terminals being connected to the second set of plug-like elements;

wherein the power semiconductor chips arranged on the on the metallization layer are arranged in at least one straight row, each of the at least on straight rows running in a first direction;

wherein the further electronic component is arranged in a second direction perpendicular to the first direction; and wherein the first sheet metal strip line and the second sheet metal strip line expand over the area of the power semiconductor module in the second direction and run parallel to the rows of the power semiconductor chips.

23. The semiconductor arrangement of claim 16, wherein the metal strip lines are separated by an insulator.

* * * * *